United States Patent [19]

Nakaboh et al.

[11] Patent Number: 4,599,241
[45] Date of Patent: Jul. 8, 1986

[54] METHOD FOR INSPECTING DEFECTS OF THIN MATERIAL FILM

[75] Inventors: Hiroshi Nakaboh; Ken Ogura, both of Tokyo, Japan

[73] Assignee: Oki Electric Industry Co., Ltd., Tokyo, Japan

[21] Appl. No.: 683,202

[22] Filed: Dec. 18, 1984

[30] Foreign Application Priority Data

Dec. 28, 1983 [JP] Japan ................. 58-245228

[51] Int. Cl.$^4$ .................... B05D 5/12; H01L 21/66
[52] U.S. Cl. .................................... 427/8; 29/574; 427/82
[58] Field of Search ................ 29/574; 427/8, 82

[56] References Cited

U.S. PATENT DOCUMENTS

| | | | |
|---|---|---|---|
| 3,672,980 | 6/1972 | Glendinning | 427/8 |
| 4,473,795 | 9/1984 | Wood | 29/574 |
| 4,514,436 | 4/1985 | Moerschel | 29/574 |

OTHER PUBLICATIONS

Ing et al, "Gas Permeation Study . . . ", Journal of the Electrochemical Society, vol. 109, No. 3, Mar., 1962, pp. 221-225.

"Search Report II concerning New Electric Materials", (most pertinent—p. 25, lines 4-5 from the bottom). (Date of publication unknown).

Primary Examiner—John D. Smith
Attorney, Agent, or Firm—Wenderoth, Lind & Ponack

[57] ABSTRACT

A thin material film for the manufacture of a semiconductor device is inspected in the presence of pinholes therein. This is achieved by forming a reactive material film which can gasify through a chemical reaction with a reactive solution on the surface of a semiconductor substrate and thin material film to be tested which can chemically resist the reactive solution is formed on the surface of the reactive material film, whereby the structure obtained by the above steps is immersed into the reactive solution.

4 Claims, 3 Drawing Figures

METHOD FOR INSPECTING DEFECTS OF THIN MATERIAL FILM

BACKGROUND OF THE INVENTION

This invention relates to a method for inspecting the qualities of a thin material film for use in a semiconductor device.

In semiconductor integrated circuit (IC) devices, thin films of a metal, a semiconductor, or an insulator are commonly used to form conductor layers, gate electrodes, gate indulating layers, or the like. In general, these films are formed by spattering, vapor-deposition, or chemical-vapor deposition (CVD) processes. In case such process conditions for making a thin material film are introduced into IC device manufacturing lines, it is important to carefully inspect and ascertain the quality of the thin film for the purpose of improving the yield of semiconductor IC devices. Ideally, it is desirable that such thin material films have no pinholes therein to obtain a good yield of IC devices. A thin material film having a large pinhole density will degrade the reliability of IC devices.

There are a number of ways for inspecting the quality of a thin material film. For example, pinhole inspection of an aluminum film over a semiconductor substrate has been carried out by directly counting the pinholes therein under a microscope. However, since this method counts pinholes in an aluminum film in a narrow limited scope of microscope, it has been difficult to determine the pinhole density in a short time. In addition, there is the copper decoration method which is applicable to thin insulating material film. Mary L. Long describes this method in his paper entitled "Quantitative Evaluation of Photoresist", on page 228, in the paper on Microminiaturization issued by Kodak Seminar in 1970. The method comprises the steps of applying a photoresist film having a predetermined thickness on the surface of a silicon substrate, baking the photoresist film at 150° C. for about 30 minutes, immersing the structure obtained by the above steps into an electrolyte with the substrate being connected to a positive electrode of a battery and an electrode in the electrolyte being connected to a negative electrode of the battery, and then counting the copper deposited portions of the pinholes therein under microscope. However, it is difficult to accurately count the pinholes, since copper material sometimes deposits on the surface of a thin film in addition to the inside of the pinholes therein. Furthermore, this method has required a long time to deposit a copper film, and it is not suitable to inspect the defects of thin metal film.

SUMMARY OF THE INVENTION

It is therefore an object of the present invention to provide a method of accurately inspecting the pinhole defects of a thin material film.

It is another object of the present invention to provide a method of being capable of counting the pinholes in a thin material film in a short time with the naked eye.

The present invention provides an improved method of inspecting pinhole defects of a thin material film for use in the manufacture of a semiconductor device. The method according to the present invention comprises the steps of forming on the surface of a semiconductor substrate a reactive material film which can gasify through a chemical reaction with a reactive solution; forming on the surface of the reactive material film a thin material film to be tested which can chemically resist the reactive solution; and immersing the structure obtained by the above steps into the reactive solution.

The above and other objects, features and advantages of the invention will be more apparent from the ensuring detailed description taken in conjunction with the accompanying drawings.

DETAILED DESCRIPTION

One embodiment according to this invention will be described with reference to FIGS. 1 to 3.

First, a semiconductor substrate, e.g., a silicon substrate, and a reactive solution which can produce a reactive gas by a chemical reaction with a heat-resistant organic molecular resin material are prepared. For example, a polyimide resin material is used as an organic molecular resin or reactive material, having the following molecular structure.

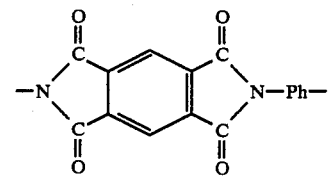

The polyimide resin material has a weight reduction starting temperature of about 500° C.

Figure 1:
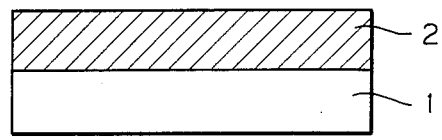
FIGS. 1 through 3 are sectional views showing the steps for finding pinhole defects in an aluminum film according to this invention.

As shown in FIG. 1, the polyimide resin film 2 is applied on the entire surface of a silicon wafer 1 by using a spinner. Then, the polyimide resin film 2 is baked at temperatures of 100°-300° C. for about 30 minutes to cure and has a thickness of 1–2 μm.

Figure 2:
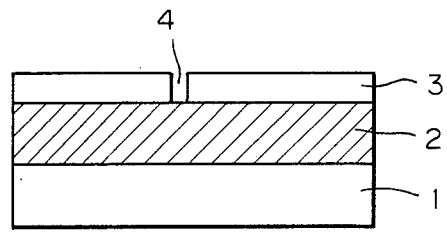
Figure 3:
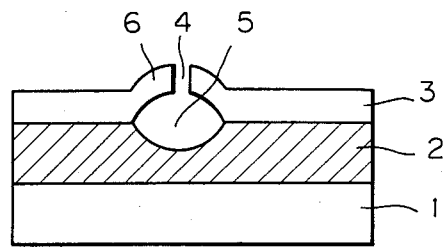

Next, as shown in FIG. 2, an aluminum layer 3 to be inspected as a thin material film in respect to its film properties is formed on the entire surface of the silicon substrate 1 by a vapor-deposition or spattering process. The thin material film to be inspected may be 0.1–1 μm in thickness and is desirable to be formed at a temperature less than the heat-resistant temperature of the reactive material.

Thereafter, the structure obtained by the above steps is immersed into a 98% concentrated nitric acid for 5 to 10 minutes a room temperature, and the rinsed in clean water.

If the aluminum film 3 has a pinhole 4, the polyimide resin film 2 in the pinhole 4 reacts with the concentrated nitric acid to produce a reactive gas. The gas causes the lift of aluminum film 3 around the pinhole 4 so as to make a pimple 6 on the surface thereof, a hollowed portion 6 is formed. In case the pinhole in the aluminum film 3 is about 1 μm in diameter, the lifted portion or aluminum pimple 5 having a diameter of several millimeters will be formed, whereby the presence of pinholes can be easily observed as white spots with the naked eyes. Then, the pinhole density is measured by directly counting the aluminum pimples per unit area. This method according to this invention is repeated by changing the thickness of aluminum film to evaluate the property thereof.

In the first embodiment, as the material film to be tested can be used an Al-Si-Cu material, tungsten, and molybdenum. In case insulating materials, such as chemical vapor deposition (CVD) polycrystalline silicon, CVD silicon nitride, CVD silicon oxide are tested, there is selected as the reactive solution, a mixed solution of hydrochloric acid and hydrogen peroxide, or of sulfuric acid and hydrogen peroxide (see Table I).

TABLE I

| Reactive Material | Reactive Solution | Material To Be Tested |
|---|---|---|
| Polyimide Resin | Concentrated Nitride Acid | Aluminum Al—Si—Cu Tungsten Molybdenum |
|  | Hydrochloric Acid and Hydrogen Peroxide | CVD Polycrystalline Silicon CVD Silicon Nitride CVD SiO$_2$ |
|  | Sulfuric Acid and Hydrogen Peroxide | CVD Polycrystalline Silicon CVD Silicon Nitride CVD SiO$_2$ |

In the second embodiment according to this invention, an epoxy resin material can be used as an organic molecular resin, for example, having the following molecular structure.

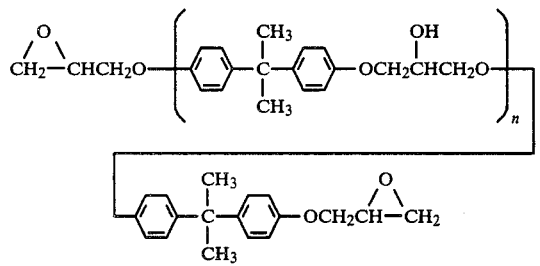

In this case, first, an epoxy resin film is formed on the surface of a substrate with a spinner, and then baked to cure. Next, for example, an aluminum film to be tested is formed on the surface of the epoxy resin film. Thereafter, the structure obtained by the above steps is immersed into a concentrated nitric acid, and then rinsed in clean water. If the aluminum film has pinholes, the epoxy resin film therein chemically reacts with concentrated nitric acid to gasify the epoxy resin film. This raises the aluminum layer around the pinholes and makes easy for a viewer to inspect the surface condition of the film. In the second embodiment, as the material film to be tested can be applied an Al-Si-Cu material, tungsten, and molybdenum. In case insulating materials such as chemical vapor deposition (CVD) polycrystalline silicon, CVD silicon nitride, CVD silicon oxide are tested, there is used a reactive solution, a mixed solution of hydrochloric acid and hydrogen peroxide, or of sulfuric acid and hydrogen peroxide (see Table II).

TABLE II

| Reactive Material | Reactive Solution | Material To Be Tested |
|---|---|---|
| Epoxy Resin | Concentrated Nitride Acid | Aluminum Al—Si—Cu Tungsten Molybdenum |
|  | Hydrochloric Acid and Hydrogen Peroxide | CVD Polycrystalline Silicon CVD Silicon Nitride CVD SiO$_2$ |
|  | Sulfuric Acid and hydrogen Peroxide | CVD Polycrystalline Silicon CVD Silicon Nitride CVD SiO$_2$ |

As described above, according to this invention, since an observer can measure the pinhole density of a thin material film with naked eyes, the quality evaluation thereof is carried out in a short time. The method according to this invention is particularly effective for a thin material film of 0.01 to several μm in thickness. Therefore, the process condition for a thin material film ascertained by this invention will boost the reliability and quality of IC devices.

What is claimed is:

1. A method for inspecting defects of a thin material film for the use in the manufacture of a semiconductor device comprising the steps of:
   forming on a semiconductor substrate a reactive material film which can gasify through a chemical reaction with a reactive solution;
   forming on a surface of said reactive material film a thin material film to be tested which is chemically resistant to said reactive solution;
   immersing the structure obtained by said steps into said reactive solution so as to react with said reactive material film through any pinholes present in the test materials to form pimples on the exposed surface of the test material film; and
   counting the number of pimples of said test material film which are formed by a reactive gas, said reactive gas being produced through the chemical reaction between said reactive material film and said reactive solution so as to lift said test material film around pinholes therein, thereby determining the number of pinholes in the film, based on the number of pimples formed.

2. A method for inspecting defects of a thin material film for the use in the manufacture of a semiconductor device comprising the steps of:
   forming on a semiconductor substrate a reactive material film comprising a member selected from the group of a polyimide resin material and epoxy resin material;
   forming on a surface of said reactive material film a thin material film to be tested which is chemically resistant to a concentrated nitric acid solution, said test material film comprising a member selected from the group of aluminum, Al-Si-Cu, W and Mo;
   immersing the structure obtained by said steps into said concentrated nitric acid solution so as to react with said reactive material film through any pinholes present in the test materials to form pimples on the surface of the test material film; and
   counting the number of pimples of said test material film formed on said semiconductor substrate, thereby determining the number of pinholes in the film, based on the number of pimples formed.

3. A method for inspecting defects of a thin material film for the use in manufacture of a semiconductor device comprising the steps of:
   forming on a semiconductor substrate a reactive material film comprising a member selected from the group of a polyimide resin material and an epoxy resin material;

forming on a surface of said reactive material film a thin material film to be tested which is chemically resistant to a mixed solution of hydrochloric acid and hydrogen peroxide, said test material film comprising a member selected from the group of CVD polycrystalline silicon, CVD silicon nitride, and SiO$_2$;

immersing the structure obtained by said steps into said mixed solution so as to react with said reactive material film through any pinholes present in the test materials to form pimples on the surface of the test material film; and counting the number of pimples of said test material film formed on said semiconductor substrate, thereby determining the number of pinholes in the film, based on the number of pimples formed.

4. A method for inspecting defects of a thin material film for the use in the manufacture of a semiconductor device comprising the steps of:

forming on a semiconductor substrate a reactive material film comprising a member selected from the group of a polyimide resin material and epoxy resin material;

forming on a surface of said reactive material film a thin material film to be tested which is chemically resistant to a mixed solution of sulfuric acid and hydrogen peroxide, said test material film comprising a member selected from the group of CVD polycrystalline silicon, CVD silicon nitride, and SiO$_2$;

immersing the structure obtained by said steps into said mixed solution so as to react with said reactive material film through any pinholes present in the test materials to form pimples on the surface of the test material film; and counting the number of pimples of said test material film formed on said semiconductor substrate, thereby determining the number of pinholes in the film, based on the number of pimples formed.

* * * * *